(12) United States Patent
Adachi et al.

(10) Patent No.: US 7,911,112 B2
(45) Date of Patent: Mar. 22, 2011

(54) ULTRASONIC ACTUATOR

(75) Inventors: Yusuke Adachi, Osaka (JP); Hiroshi Fukushima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/919,994

(22) PCT Filed: Dec. 14, 2006

(86) PCT No.: PCT/JP2006/324931
§ 371 (c)(1),
(2), (4) Date: Nov. 7, 2007

(87) PCT Pub. No.: WO2007/069682
PCT Pub. Date: Jun. 21, 2007

(65) Prior Publication Data
US 2009/0026884 A1 Jan. 29, 2009

(30) Foreign Application Priority Data

Dec. 15, 2005 (JP) ................. 2005-361578

(51) Int. Cl.
*H01L 41/04* (2006.01)
*H02N 2/08* (2006.01)

(52) U.S. Cl. ................ 310/323.01; 310/323.16
(58) Field of Classification Search ........... 310/323.01–323.12, 328
See application file for complete search history.

(56) References Cited

U.S. PATENT DOCUMENTS

| 6,104,123 | A * | 8/2000 | Okazaki et al. | 310/323.09 |
| 6,806,620 | B1 * | 10/2004 | Wischnewskiy | 310/323.02 |
| 2003/0201695 | A1 * | 10/2003 | Funakubo et al. | 310/323.01 |
| 2003/0234596 | A1 * | 12/2003 | Johansson et al. | 310/328 |

FOREIGN PATENT DOCUMENTS

| JP | 05-278890 | 10/1993 |
| JP | 07-231685 | 8/1995 |
| JP | 2004-304963 | 10/2004 |
| JP | 2005-328594 | 11/2005 |

* cited by examiner

*Primary Examiner* — Derek J Rosenau
(74) *Attorney, Agent, or Firm* — McDermott Will & Emery LLP

(57) ABSTRACT

An ultrasonic actuator includes: a piezoelectric element 1 for generating a bending vibration and a stretching vibration; and a driver element 2 attached to a surface of the piezoelectric element 1 facing the direction of the bending vibration in point contact with the piezoelectric element 1 and actuated in accordance with the vibration of the piezoelectric element 1 to output driving force.

17 Claims, 16 Drawing Sheets

ULTRASONIC ACTUATOR

RELATED APPLICATIONS

This application is the U.S. National Phase under 35 U.S.C. §371 of International Application No. PCT/JP2006/324931, filed on Dec. 14, 2006, which in turn claims the benefit of Japanese Application No. 2005-361578, filed on Dec. 15, 2005, the disclosures of which Applications are incorporated by reference herein.

TECHNICAL FIELD

The present invention relates to a vibration actuator used for various electronic devices. In particular, it relates to an ultrasonic actuator using an electromechanical transducer element.

BACKGROUND ART

A conventional ultrasonic actuator is shown in FIGS. 13 and 14. FIG. 13 is a perspective view of a piezoelectric element of the conventional ultrasonic actuator and FIG. 14 is a sectional view of the same.

A piezoelectric element 100 is supported by five supporting parts 101A, 101B, 101C, 101D and 101E. The piezoelectric element 100 includes four quadrant electrodes 102a, 102b, 102c and 102d formed on a surface of the piezoelectric element 100 and an overall electrode (not shown) formed to cover the entire area of an opposite surface of the piezoelectric element 100.

A wire 104a is connected to the electrode 102a by a solder 105a and to the electrode 102d by a solder 105d. A wire 104b is connected to the electrode 102b by a solder 105b and to the electrode 102c by a solder 105c. Further, a wire 104g is connected to the overall electrode. A voltage is applied to the piezoelectric element 100 through the wires 104a, 104b and 104g.

A driver element 102 is provided on the top surface of the piezoelectric element 100 and a head of the driver element 102 is in contact with a movable object 103. The head of the driver element 102 is pressed onto the movable object 103 by the supporting part 101C. As a result, friction between the head of the driver element 102 and the movable object 103 is increased such that the vibration of the piezoelectric element 100 is surely transmitted to the movable object 103 via the driver element 102.

Hereinafter, how to operate the ultrasonic actuator is briefly explained.

FIGS. 15, 16 and 17A to 17D are conceptual diagrams illustrating the vibration modes of the piezoelectric element.

With the wire 104g connected to ground, a sinusoidal reference voltage of a certain frequency is applied to the wire 104a and a voltage having a phase shifted by 90° or −90° relative to the reference voltage is applied to the wire 104b. Accordingly, the piezoelectric element 100 is induced to vibrate in a second-order mode of bending vibration shown in FIG. 15 and a first-order mode of stretching vibration (so-called longitudinal vibration; hereinafter may be referred to as longitudinal vibration) shown in FIG. 16.

Resonance frequencies of the bending and stretching vibrations are determined by the material and shape of the piezoelectric element 100. When the two resonance frequencies are set almost equal and a voltage having a frequency near the set frequency is applied, the piezoelectric element 100 is induced to vibrate in a second-order mode of bending vibration and a first-order mode of stretching vibration in a harmonious manner. Thus, the shape of the piezoelectric element 100 varies sequentially in the order shown in FIGS. 17A to 17D.

As a result, the driver element 102 provided on the piezoelectric element 100 makes an elliptical motion as viewed in the direction perpendicular to the page surface. That is, the bending and stretching vibrations of the piezoelectric element 100 are combined to cause the elliptical motion of the driver element 102. Due to the elliptical motion, the movable object 103 supported by the driver element 102 moves in the direction of an arrow A or B. Thus, the function of the ultrasonic actuator is achieved.

Further, as shown in FIG. 18, another piezoelectric actuator has been proposed which includes a rectangular piezoelectric element 110 and a plurality of substantially hemispherical driver elements 112.

As a known prior art document related to the invention of the present application, for example, we note Patent Literature 1: Japanese Unexamined Patent Publication No. 2004-304963.

DISCLOSURE OF THE INVENTION

Problem that the Invention is to Solve

In recent years, downsizing of the ultrasonic actuator has been demanded with the trend of downsizing of electronic devices. If the ultrasonic actuator is downsized, however, there is a possibility of decrease in efficiency.

Specifically, the size of the driver element has to be relatively increased in order to ensure the rigidity of the driver element. If the substantially hemispherical driver element is provided at the antinode of the bending vibration of the piezoelectric element as described above, the driver element hinders the bending vibration of the piezoelectric element. As a result, the efficiency may possibly be decreased.

In view of the above, the present invention aims to reduce the hindrance to the vibration of the piezoelectric element caused by the driver element and improve the efficiency of the ultrasonic actuator.

Means of Solving the Problem

In order to accomplish the aim, an ultrasonic actuator of the present invention includes: an actuator body consisting of or including a piezoelectric element for generating various kinds of vibrations having different vibration directions including at least a bending vibration; and a driver element attached to a surface of the actuator body facing the direction of the bending vibration of the actuator body in point and/or line contact with the actuator body and actuated in accordance with the vibration of the actuator body to output driving force.

Effect of the Invention

According to the present invention, an area of contact between the driver element and the actuator body is reduced as much as possible and the hindrance to the bending vibration of the actuator body caused by the driver element is reduced. As a result, the efficiency of the ultrasonic actuator is improved.

Figure 1:
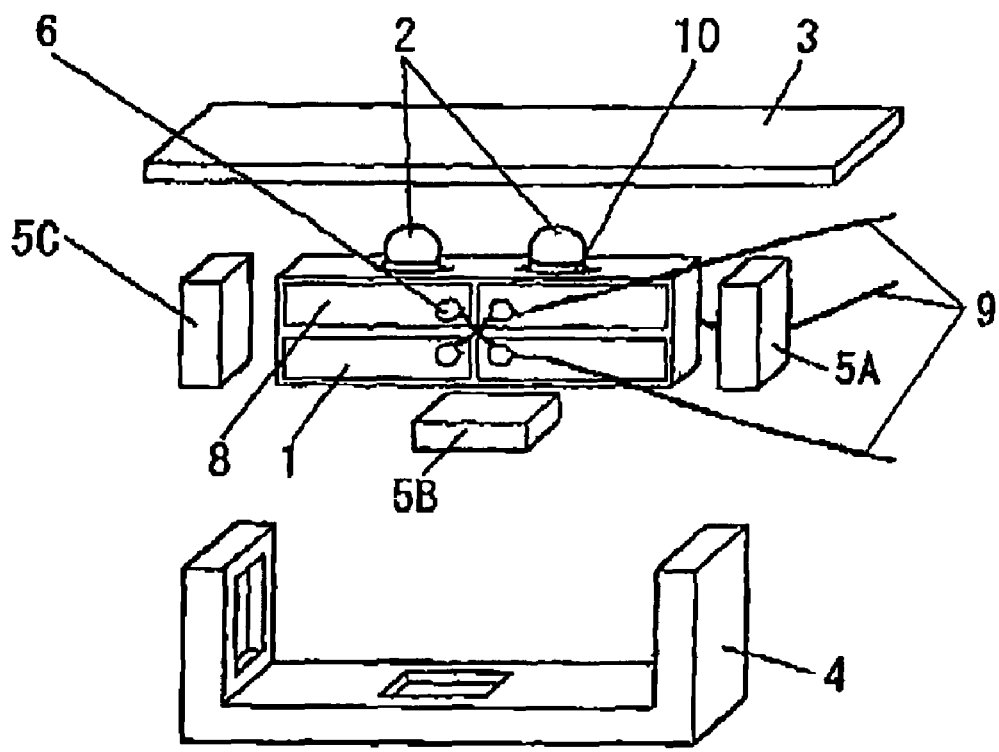
FIG. 1 is an exploded perspective view of an ultrasonic actuator according to a first embodiment of the present invention.

EXPLANATION OF REFERENCE NUMERALS 1, 1b, 1c, 1d, 1e, 1f, 1g Piezoelectric element
1a Resonator
2 Driver element
3 Movable object
4 Case
5A, 5C Wall-surface supporting part
5B Bottom-surface supporting part
6 Solder
8 Feeding electrode
9 Wire
10 Adhesive
32 Conductive part
35A, 35C Wall-surface supporting part
35B Bottom-surface supporting part
37 Lead electrode
71 Annular component

BEST MODE FOR CARRYING OUT THE INVENTION

Hereinafter, embodiments of the present invention will be explained in detail with reference to the figures.

First Embodiment

Figure 2:
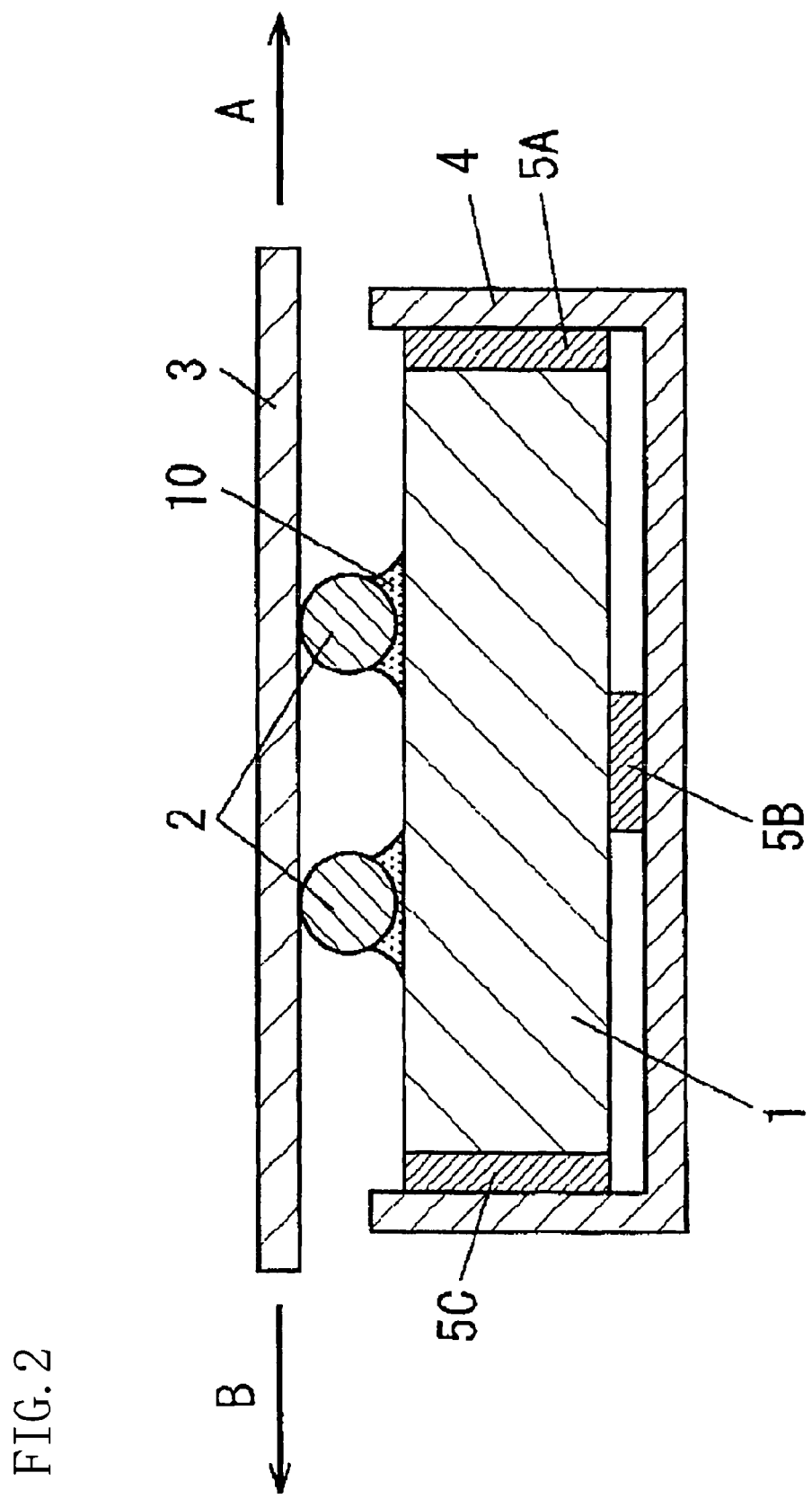
FIG. 2 is a sectional view of the ultrasonic actuator.

FIG. 1 is an exploded perspective view of an ultrasonic actuator according to a first embodiment of the present invention. FIG. 2 is a sectional view of the same.

Referring to FIGS. 1 and 2, two spherical driver elements 2 are provided on the surface of a piezoelectric element 1 made of piezoelectric material such as PZT or quartz.

The piezoelectric element 1 includes quadrant feeding electrodes 8 formed on the front surface thereof and an overall electrode (not shown) formed on the rear surface thereof. Wires 9 are connected to the feeding electrodes 8 and the overall electrode by solders 6. The wires 9 are guided out of a case 4 via through holes (not shown) formed in the case 4. When AC voltage of a certain frequency is applied to the feeding electrodes 8 and the overall electrode via the wires 9, the piezoelectric element 1 vibrates in accordance with the frequency of the applied voltage. More specifically, the piezoelectric element 1 causes stretching vibration in the long side direction and bending vibration in the short side direction. The piezoelectric element 1 constitutes an actuator body.

The solders 6 are formed on part of the piezoelectric element 1 near the node of the stretching and bending vibrations. As the wires 9 are connected at the node, adverse effect on the vibrations of the piezoelectric element 1, i.e., unwanted load applied to the piezoelectric element 1 by the formation of the solders 6, is reduced as much as possible.

Figure 6:
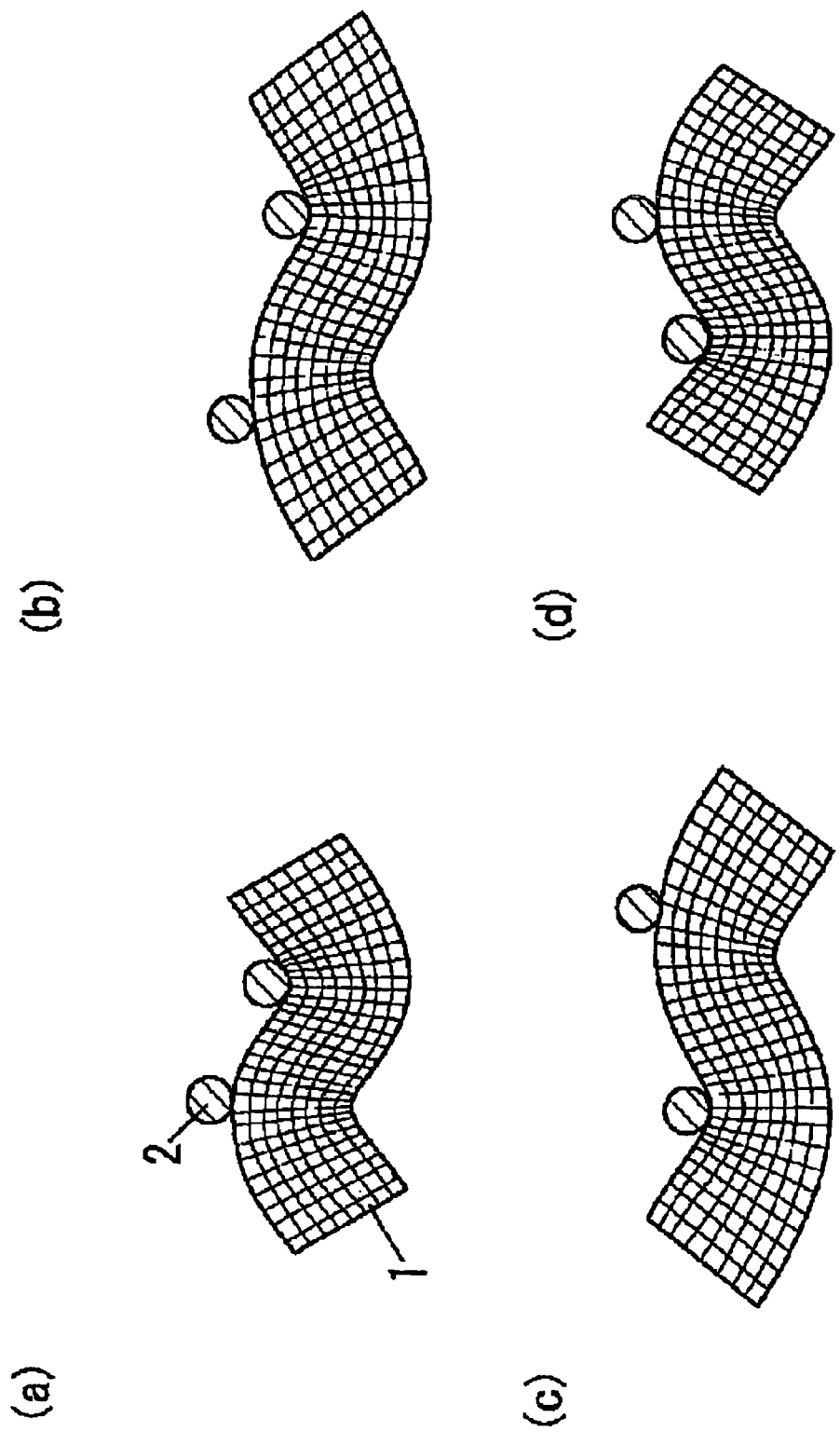
FIGS. 6A to 6D are conceptual diagrams illustrating the operation of the ultrasonic actuator.

The driver elements 2 are bonded to the piezoelectric element 1 with an adhesive 10. More specifically, as shown in FIGS. 2 and 6, the driver elements 2 are bonded to the surface of the piezoelectric element 1 facing the direction of the bending vibration (top surface of the piezoelectric element 1 in FIGS. 2 and 6). Examples of material for the driver elements 2 include zirconia, alumina, silicon nitride, silicon carbide, tungsten carbide and the like. Parts of the piezoelectric element 1 to which the driver elements 2 are bonded are almost at the center of the antinode of the bending vibration of the piezoelectric element 1. With the driver elements 2 provided on these parts, the vibration of the piezoelectric element 1 is utilized at higher efficiency.

The driver elements 2 are bonded to the top surface of the piezoelectric element 1 (the surface facing the direction of the bending vibration) in point contact with the piezoelectric element 1 as shown in FIG. 2. The "point contact" signifies not only the state where the driver elements 2 and the piezoelectric element 1 are strictly in contact with each other but also the state where the driver elements 2 and the piezoelectric element 1 are substantially in point contact with each other with the adhesive 10 interposed therebetween.

The adhesive 10 is preferably softer than the materials of the piezoelectric element and the driver elements. Specific examples thereof include a synthetic resin, in particular an epoxy resin, an acrylic resin and a silicone resin. With use of such material, the driver elements 2 and the piezoelectric element 1 are fixed together while the hindrance to the bending vibration of the piezoelectric element 1 is avoided as much as possible.

The piezoelectric element 1 is contained in the case 4 and supported by supporting parts 5A to 5C placed in the case 4. More specifically, the piezoelectric element 1 is placed in the case 4 such that the stretching direction (lengthwise direction) of the piezoelectric element 1 corresponds with the moving direction of a movable object 3 to be described later (the direction in which the driving force of the ultrasonic actuator is output, i.e., the directions A and B shown in FIG. 2). Then, wall-surface supporting parts 5A and 5C are arranged on the inner wall surfaces of the case 4 to be aligned in the moving direction of the movable object 3. A bottom-surface supporting part 5B is arranged on the inner bottom surface of the case 4 to support the piezoelectric element 1. That is, both end faces of the piezoelectric element 1 in the lengthwise direction are supported by the inner wall surfaces of the case 4 with the wall-surface supporting parts 5A and 5C interposed therebetween.

The bottom-surface supporting part 5B is provided such that the driver elements 2 pressurize and supports the movable object 3 (i.e., the driver elements 2 abut the movable object 3). Thus, the movable object 3 is operated with stability. The two driver elements 2 supporting the movable object 3 are configured to apply substantially the same pressure when no voltage is applied to the feeding electrodes 8.

Figure 3:
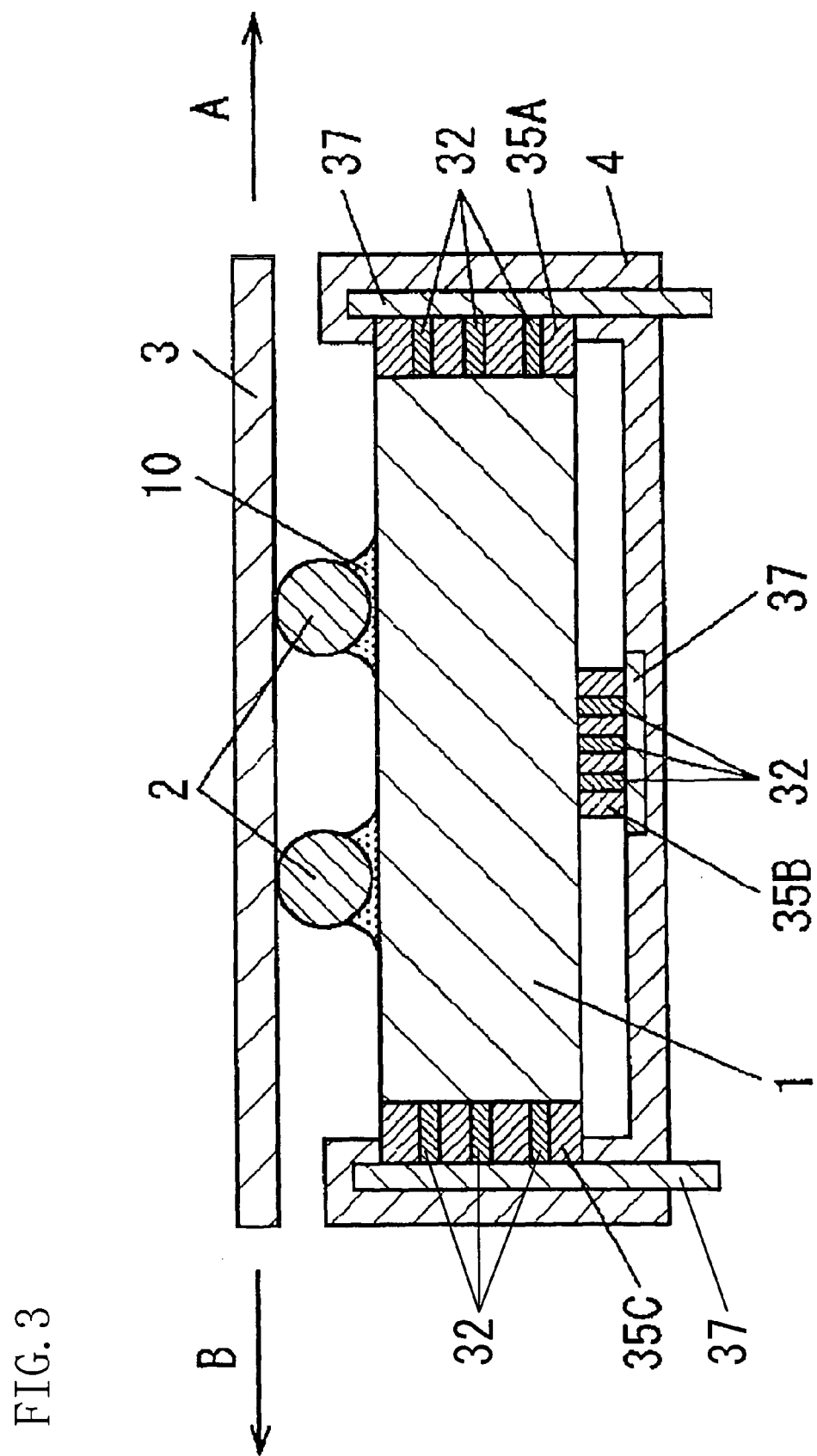
FIG. 3 is a sectional view of an ultrasonic actuator according to a modified embodiment.

The wall-surface supporting parts and the bottom-surface supporting part are consisted of an elastic member such as a leaf spring or rubber. Further, they may include conductive parts 32 as shown in FIG. 3. Lead electrodes 37 are provided in the walls and the bottom of the case 4 to be conducted with the feeding electrodes (not shown) of the piezoelectric element 1 via the conductive parts 32 of the wall-surface supporting parts 35A and 35C and the bottom-surface supporting part 35B.

When the piezoelectric element 1 vibrates, the driver elements 2 supporting the movable object 3 (abutting the movable object 3) make a substantially elliptical motion to move the movable object 3 in the direction of A or B shown in FIG. 2. That is, the driver elements 2 output driving force in the directions of A and B by making the substantially elliptical motion. The direction of the stretching vibration of the piezoelectric element 1 is the same as the moving direction of the movable object 3. Further, the direction of the bending vibration is perpendicular to the moving direction of the movable object 3 and the same as the direction connecting the piezoelectric element 1 and the movable object 3 (the direction in which the driver elements 2 support the movable object 3).

The movable object 3 may be made of alumina. If the driver elements 2 are made of alumina, the movable object 3 is preferably made of alumina softer than that for the driver elements 2 in view of wear.

In other words, the thus-configured ultrasonic actuator includes the piezoelectric element 1 having the feeding electrodes 8, the driver elements 2 formed on the surface of the piezoelectric element 1 and the movable object 3 supported by the driver elements 2. The piezoelectric element 1 generates various kinds of vibrations in combination including at least the bending vibration upon application of a voltage to the feeding electrodes 8 such that the driver elements 2 make a substantially elliptical motion in response to the vibrations to move the movable object 3 relatively to the piezoelectric element 1. The driver elements 2 are substantially spherical and mounted on the surface of the piezoelectric element 1 facing the direction of the bending direction of the piezoelectric element 1.

Next, the operation of the above-described ultrasonic actuator will be explained with reference to FIGS. 4 to 6.

Figure 4:
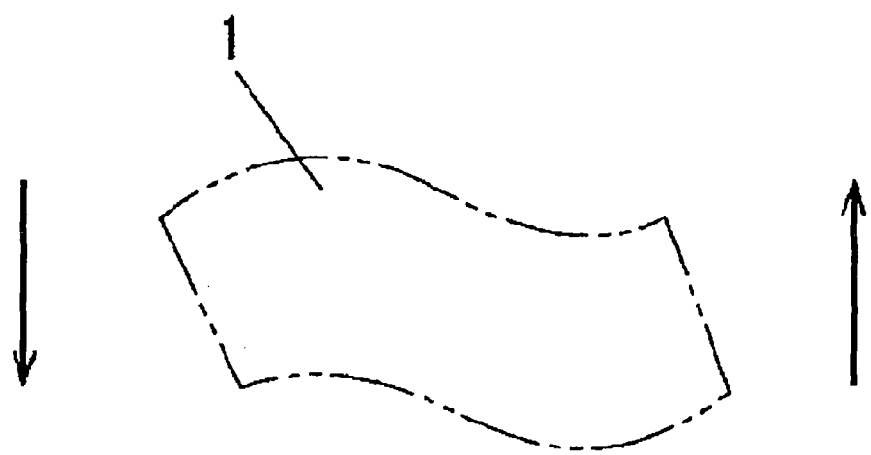
FIG. 4 is a diagram illustrating displacement in a second-order mode of bending vibration.
Figure 5:
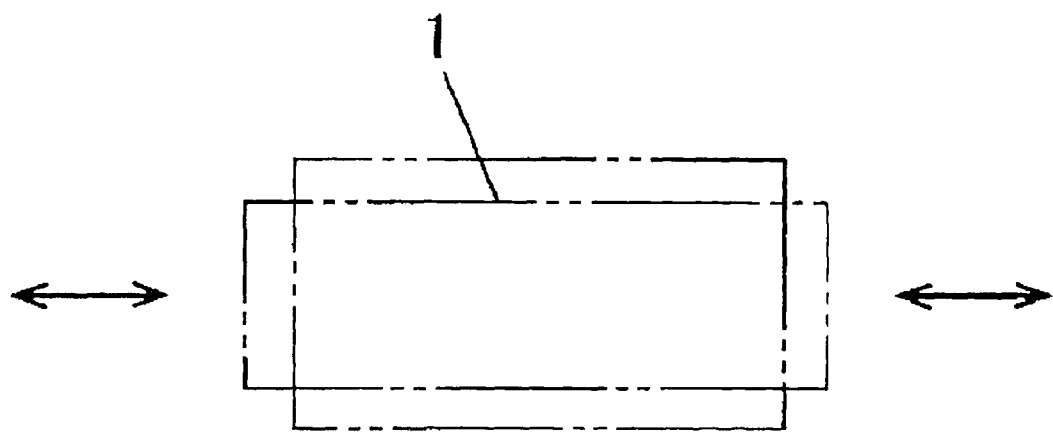
FIG. 5 is a diagram illustrating displacement in a first-order mode of stretching vibration.

When AC voltage of a certain frequency is applied to a certain feeding electrode 8 of the piezoelectric element 1 via the conductive parts 32, the piezoelectric element 1 is induced to vibrate in a second-order mode of bending vibration shown in FIG. 4 and a first-order mode of stretching vibration shown in FIG. 5. Resonance frequencies of the bending and stretching vibrations are determined by the material and size of the piezoelectric element. If the two frequencies are set almost equal and a voltage having a frequency near the set frequency is applied, the piezoelectric element 1 is induced to vibrate in the second-order mode of bending vibration and the first-order mode of stretching vibration in a harmonious manner. Thus, the shape of the piezoelectric element 1 varies sequentially in the order shown in FIGS. 6A to 6D. As a result, the driver elements 2 provided on the piezoelectric element 1 make a substantially elliptical motion as viewed in the direction perpendicular to the page surface. That is, the piezoelectric element 1 generates the stretching and bending vibrations in a plane parallel to the page surface. As a result, the driver elements 2 make the substantially elliptical motion in the same plane.

Specifically, the driver elements 2 make the elliptical motion in response to the combination of the bending and stretching vibrations of the piezoelectric element 1. According to the elliptical motion, the movable object 3 on which the driver elements 2 abut is actuated in the direction of an arrow A or B shown in FIG. 2 or FIG. 3. Thus, the function of the ultrasonic actuator is achieved.

According to the first embodiment, the spherical driver elements 2 make it possible to reduce an area of contact between the driver elements 2 and the piezoelectric element 1 and the hindrance to the bending vibration of the piezoelectric element 1 is reduced. As a result, the efficiency of the ultrasonic actuator is improved. The term "spherical" signifies not only a strictly spherical shape but also a substantially spherical shape which allows the substantial point contact between the driver elements 2 and the piezoelectric element 1.

Second Embodiment

Next, an ultrasonic actuator according to a second embodiment of the present invention will be explained.

Figure 7:
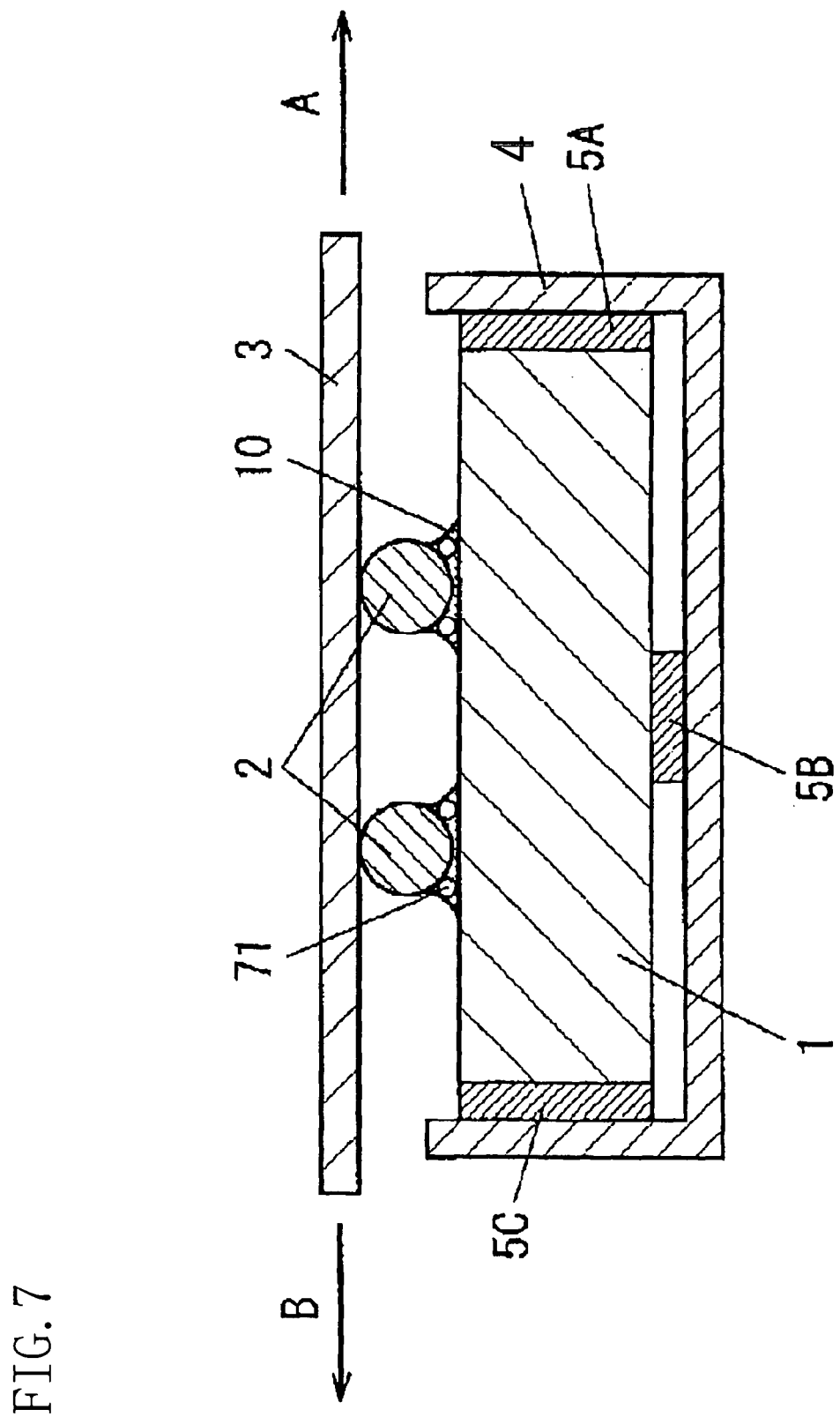
FIG. 7 is a sectional view of an ultrasonic actuator according to a second embodiment of the present invention.

In the first embodiment described above, the driver elements 2 are attached to the piezoelectric element 1 in point contact with the piezoelectric element 1 by the adhesive 10. In contrast to the first embodiment, the ultrasonic actuator of the second embodiment includes annular components 71 surrounding the driver elements 2, respectively, as shown in FIG. 7. Specifically, each of the annular components 71 is arranged to surround the point of contact between the driver element 2 and the piezoelectric element 1. That is, the driver elements 2 are in point contact with the piezoelectric element 1 and also in contact with the piezoelectric element 1 via the annular components 71 interposed therebetween. The annular components 71 are in line contact with the driver elements 2 and the piezoelectric element 1. The driver elements 2 and the annular components 71, as well as the annular components 71 and the piezoelectric element 1, are bonded to each other by the adhesive 10. The driver elements 2 may not be in point contact with the piezoelectric element 1 but only in line contact with the piezoelectric element 1 via the annular components 71 interposed therebetween. The term "line contact" is not limited to the state where the annular components 71 are strictly in contact with the driver elements 2 or the piezoelectric element 1, but includes the state where the annular components 71 and the driver elements 2 or the piezoelectric element 1 are substantially in line contact with each other with the adhesive 10 interposed therebetween.

Thus, with the provision of the annular components 71, the number of contact points between the driver elements 2 and the annular components 71, as well as between the annular components 71 and the piezoelectric element 1, is increased. As a result, bond strength between the driver elements 2 and the piezoelectric element 1 is improved. The annular components 71 are preferably made of material softer than the driver elements 2 and harder than the adhesive 10 for the purpose of improving the bond strength without hindering the vibration. For example, metals such as aluminum and iron and resins having high hardness such as epoxy and phenol are used.

Thus, according to the second embodiment, the spherical driver elements 2 are used and the driver elements 2 are brought into point contact with the piezoelectric element 1 with the annular components 71 interposed therebetween. Therefore, an area of contact between the driver elements 2 and the piezoelectric element 1 is reduced and the hindrance to the bending vibration of the piezoelectric element 1 is reduced. As a result, the efficiency of the ultrasonic actuator is improved.

Third Embodiment

Next, an ultrasonic actuator according to a third embodiment of the present invention will be explained.

In the above-described first and second embodiments, the spherical driver elements 2 are used. However, the driver elements 2 may be cylindrical. In such a case, each of the cylindrical driver elements 2 is mounted on the surface of the piezoelectric element 1 such that the axis of the cylinder is almost orthogonal to the plane in which the driver elements 2 make the substantially elliptical motion (i.e., the plane in which the piezoelectric element 1 generates the bending vibration; see FIG. 10). A cross section of this configuration is the same as that shown in FIG. 2. The cylindrical driver elements 2 are preferably fixed onto the piezoelectric element 1 using the same adhesive 10 as that used for the spherical driver elements. In this manner, the driver elements 2 are brought into line contact with the top surface of the piezoelectric element 1 (the surface facing the direction of the bending vibration). At this time, each of the driver elements 2 and the piezoelectric element 1 are brought into line contact with each other. The linear contact part is located almost at the center of the antinode of the bending vibration of the piezoelectric element 1 and extends almost orthogonal to the plane in which the driver elements 2 make the substantially elliptical motion. The "line contact" is not limited to the state where the driver elements 2 and the piezoelectric element 1 are strictly in contact with each other but includes the state where the driver elements 2 and the piezoelectric element 1 are substantially in line contact with each other with the adhesive interposed therebetween. The term "cylindrical" is not limited to a strictly cylindrical shape but includes a substantially cylindrical shape which roughly allows the line contact between the driver elements 2 and the piezoelectric element 1.

In other words, the thus-configured ultrasonic actuator includes the piezoelectric element 1 having feeding electrodes 8, the driver elements 2 provided on the surface of the piezoelectric element 1 and the movable object 3 supported by the driver elements 2. The piezoelectric element 1 generates various kinds of vibrations in combination including at least the bending vibration upon application of a voltage to the feeding electrodes 8 such that the driver elements 2 make a substantially elliptical motion in response to the vibrations to move the movable object 3 relatively to the piezoelectric element 1. The driver elements 2 are substantially cylindrical and mounted on the surface of the piezoelectric element 1 facing the direction of the bending vibration of the piezoelectric element 1 such that the axes of the substantially cylindrical driver elements are almost perpendicular to the plane in which the driver elements 2 make the substantially elliptical motion.

Thus, according to the third embodiment, the cylindrical driver elements 2 make it possible to reduce an area of contact between the driver elements 2 and the piezoelectric element 1 and the hindrance to the bending vibration of the piezoelectric element 1 is reduced. Further, as the cylindrical driver elements 2 are attached to the piezoelectric element 1 such that their axes are orthogonal to the plane in which the bending vibration of the piezoelectric element 1 occurs, the hindrance to the bending vibration of the piezoelectric element 1 is reduced to a further extent.

Fourth Embodiment

Next, an ultrasonic actuator according to a fourth embodiment of the present invention will be explained.

Figure 8:
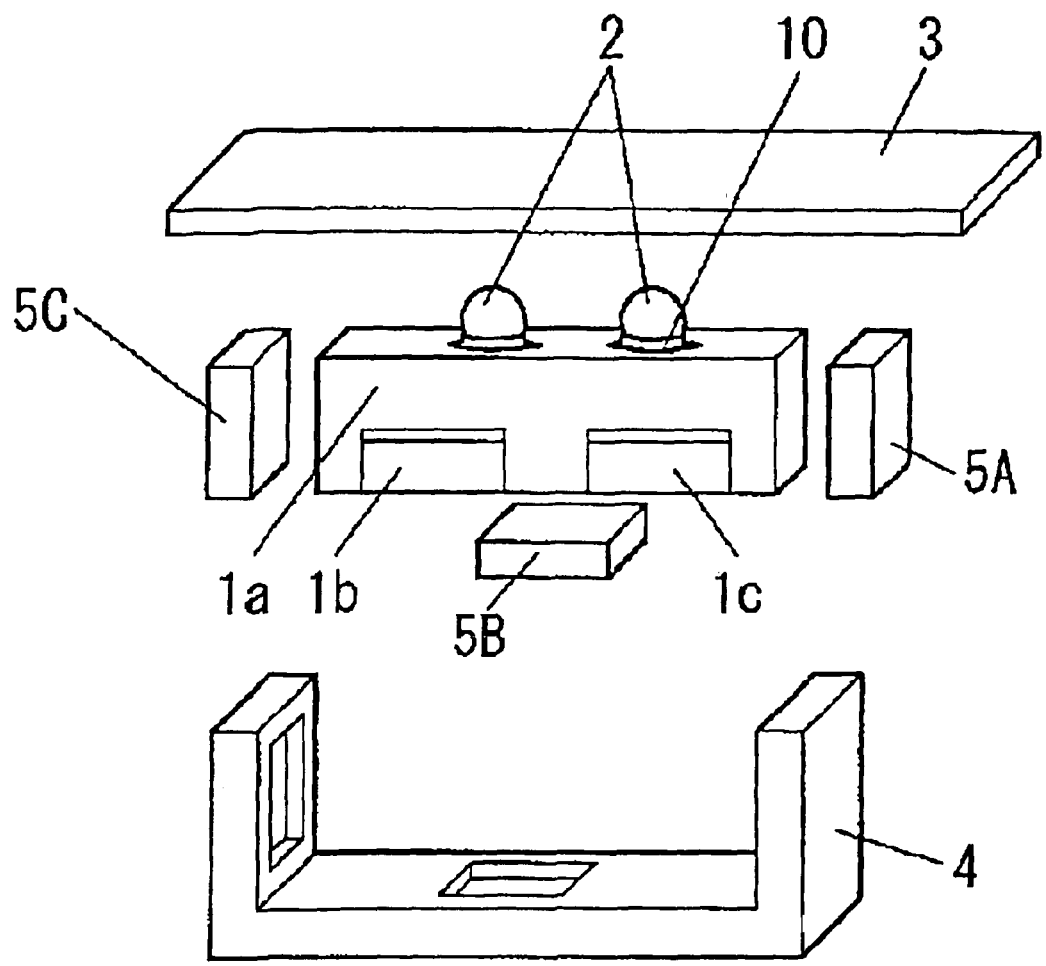
FIG. 8 is an exploded perspective view of an ultrasonic actuator according to a fourth embodiment of the present invention.
Figure 9:
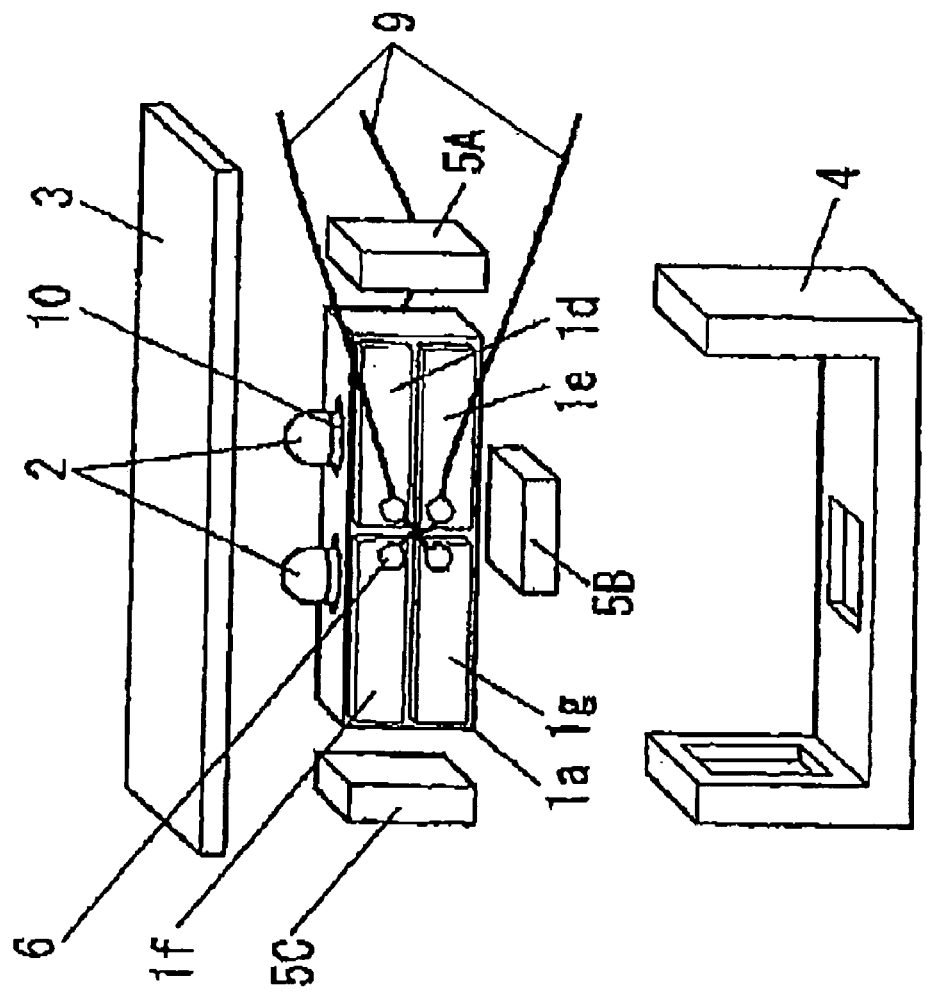
FIG. 9 is an exploded perspective view of an ultrasonic actuator according to a modification of the fourth embodiment.
Figure 10:
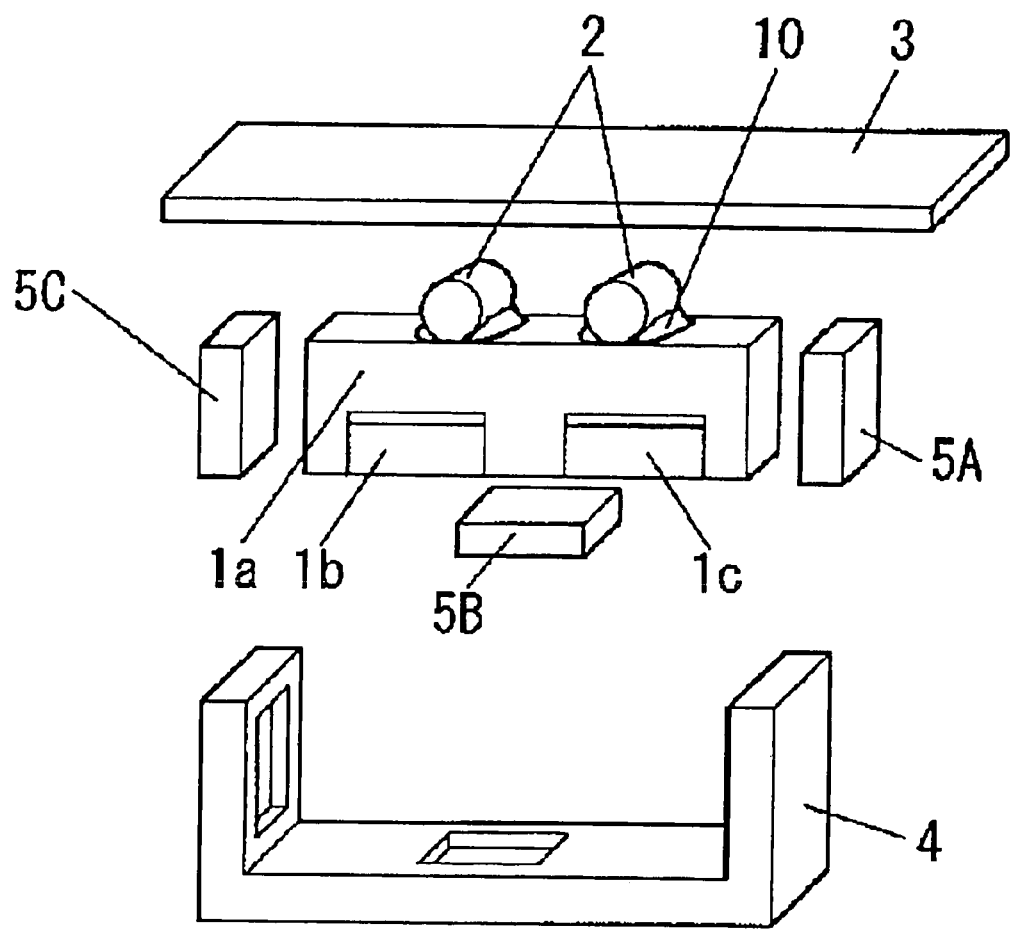
FIG. 10 is an exploded perspective view of an ultrasonic actuator according to another modification of the fourth embodiment.

FIG. 8 is an exploded perspective view of the ultrasonic actuator according to the fourth embodiment. FIGS. 9 and 10 show ultrasonic actuators according to modifications of the fourth embodiment, respectively. The fourth embodiment is different from the first to third embodiments in that a resonator is interposed between the piezoelectric element and the driver element. That is, the resonator including the piezoelectric element constitutes an actuator body.

In the ultrasonic actuator shown in FIG. 8, piezoelectric elements 1b and 1c are embedded in a resonator 1a made of metal or ceramic.

AC voltage of a certain frequency is applied to certain feeding electrodes (not shown) of the piezoelectric elements 1b and 1c in the resonator 1a. Then, the resonator 1a is induced to vibrate in a second-order mode of bending vibration shown in FIG. 4 and a first-order mode of stretching vibration shown in FIG. 5 by the piezoelectric elements 1b and 1c serving as a driving source.

More specifically, the piezoelectric elements 1b and 1c are arranged to be off-centered to one side in the short side direction of the resonator 1a (i.e., eccentric with respect to the center axis extending in the lengthwise direction). When each of the thus-arranged piezoelectric elements 1b and 1c generates the stretching vibration, the resonator 1a causes the stretching vibration in response to that of the piezoelectric elements 1b and 1c. Further, as the one side of the resonator 1a in which the eccentric piezoelectric elements 1b and 1c are arranged is stretched and shrunk, the resonator 1a causes the bending vibration.

The resonance frequencies of the bending and stretching vibrations are determined by the material and shape of the resonator 1a. When the resonator 1a is configured such that the two frequencies are set almost equal and a voltage having a frequency near the set frequency is applied, the resonator 1a is induced to vibrate in the second-order mode of bending vibration and the first-order mode of stretching vibration in a harmonious manner. Therefore, the shape of the resonator 1a varies sequentially in the order shown in FIGS. 6A to 6D. As a result, the driver elements 2 provided on the resonator 1a make a substantially elliptical motion as viewed in the direction perpendicular to the page surface. That is, the combination of the bending and stretching vibrations of the resonator 1a causes the elliptical motion of the driver elements 2. By the elliptical motion, the movable object 3 in contact with the driver elements 2 is actuated in the direction of an arrow A or B shown in FIG. 2 or FIG. 3. Thus, the function of the ultrasonic actuator is achieved.

According to the above-described structure, the volume of the expensive piezoelectric material is reduced. Therefore, the ultrasonic actuator is obtained at reduced cost.

In an ultrasonic actuator shown in FIG. 9, piezoelectric elements 1d, 1e, 1f and 1g are stuck to a resonator 1a made of metal or ceramic. Even in the thus-configured ultrasonic actuator, the substantially elliptical motion of the driver elements 2 is generated in the above-described manner to actuate the movable object 3. According to this configuration, the volume of the expensive piezoelectric material is reduced as compared with the first to third embodiments. Therefore, the ultrasonic actuator is obtained at reduced cost.

The spherical driver elements 2 explained in the above may be replaced with cylindrical driver elements 2 shown in FIG. 10. In such a case, the cylindrical driver elements 2 are mounted on the surface of the resonator 1a in line contact with the resonator 1a such that their axes are almost orthogonal to the plane in which the driver elements 2 make the substantially elliptical motion (the plane in which the resonator 1a generates the bending vibration). At this time, the linear contact part between each of the driver elements 2 and the resonator 1a is located almost at the center of the antinode of the bending vibration of the resonator 1a and extends almost orthogonal to the plane in which the driver elements 2 make the substantially elliptical motion. The cylindrical driver elements 2 are preferably attached to the resonator 1a with the same adhesive 10 as that used for the spherical driver elements 2. That is, the ultrasonic actuator of the present embodiment is configured in the same manner as that of the third embodiment except that the actuator body includes the piezoelectric elements 1b and 1c and the resonator 1a.

As described above, since the spherical or cylindrical driver elements 2 are adopted, an area of contact between the driver elements 2 and the resonator 1a is reduced as much as possible and the hindrance to the bending vibration of the resonator 1a caused by the driver elements 2 is reduced. As a result, the efficiency of the ultrasonic actuator is improved.

Other Embodiments

The embodiments of the present invention may be configured as follows.

Figure 11:
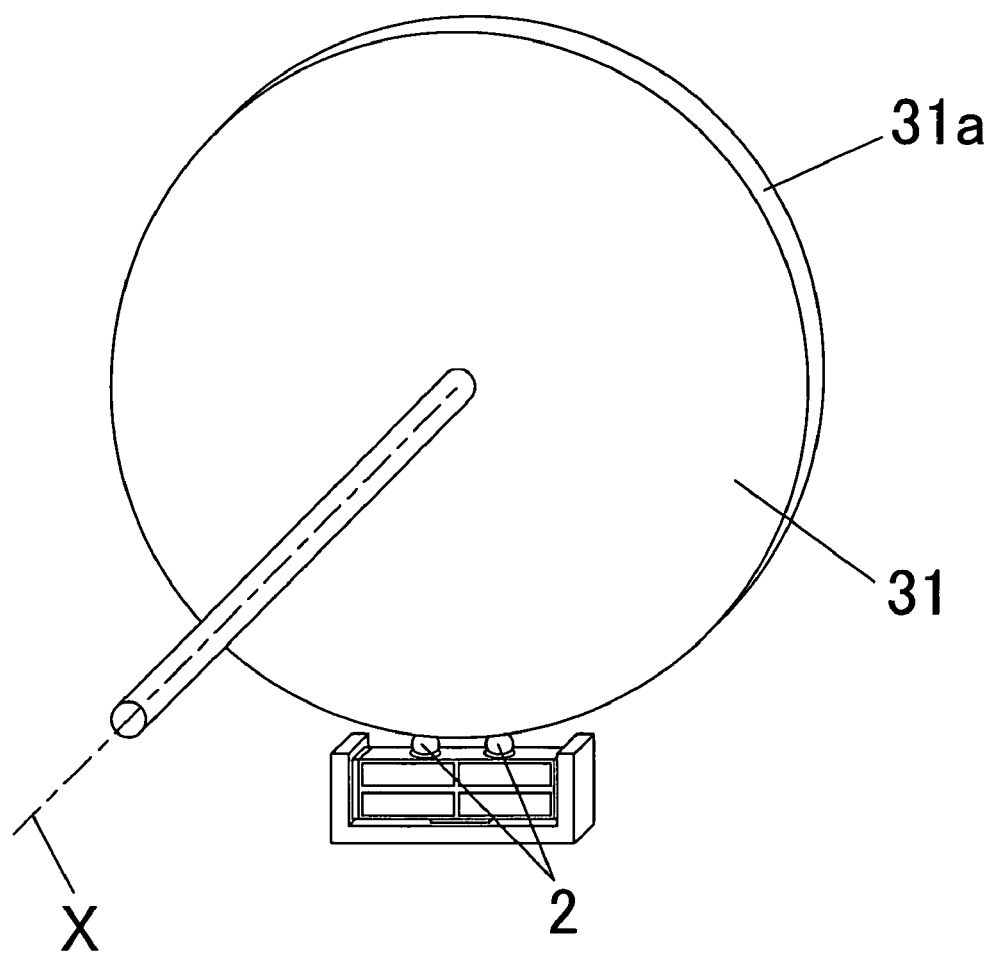
FIG. 11 is a perspective view of an ultrasonic actuator according to another embodiment.
Figure 12:
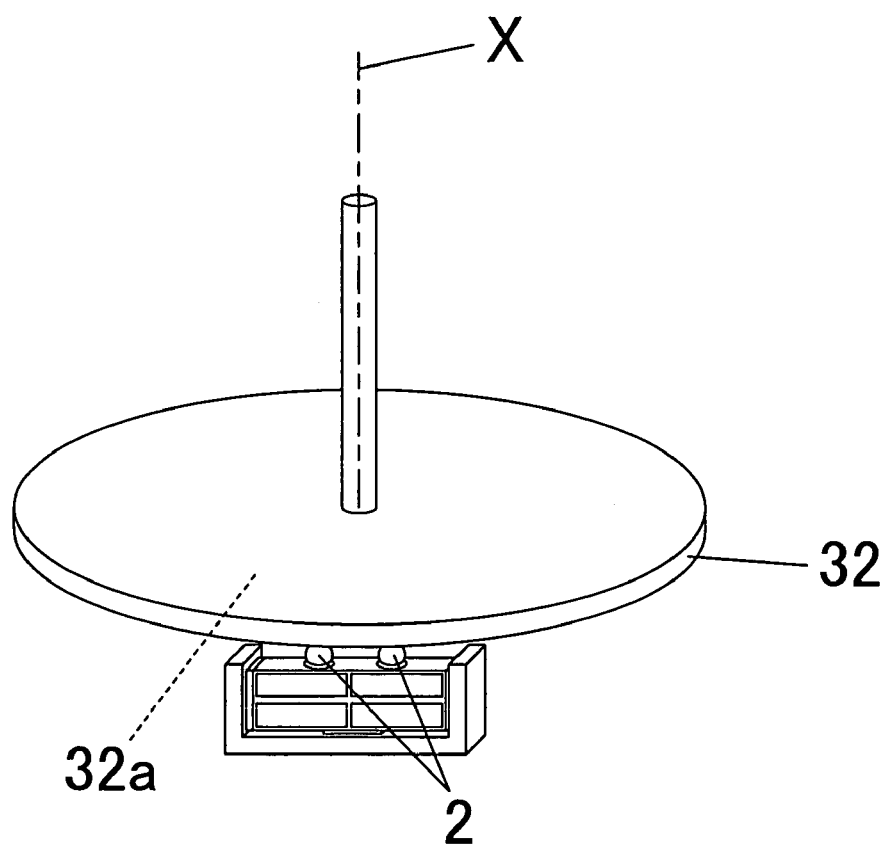
FIG. 12 is a perspective view of an ultrasonic actuator according to still another embodiment.
Figure 13:
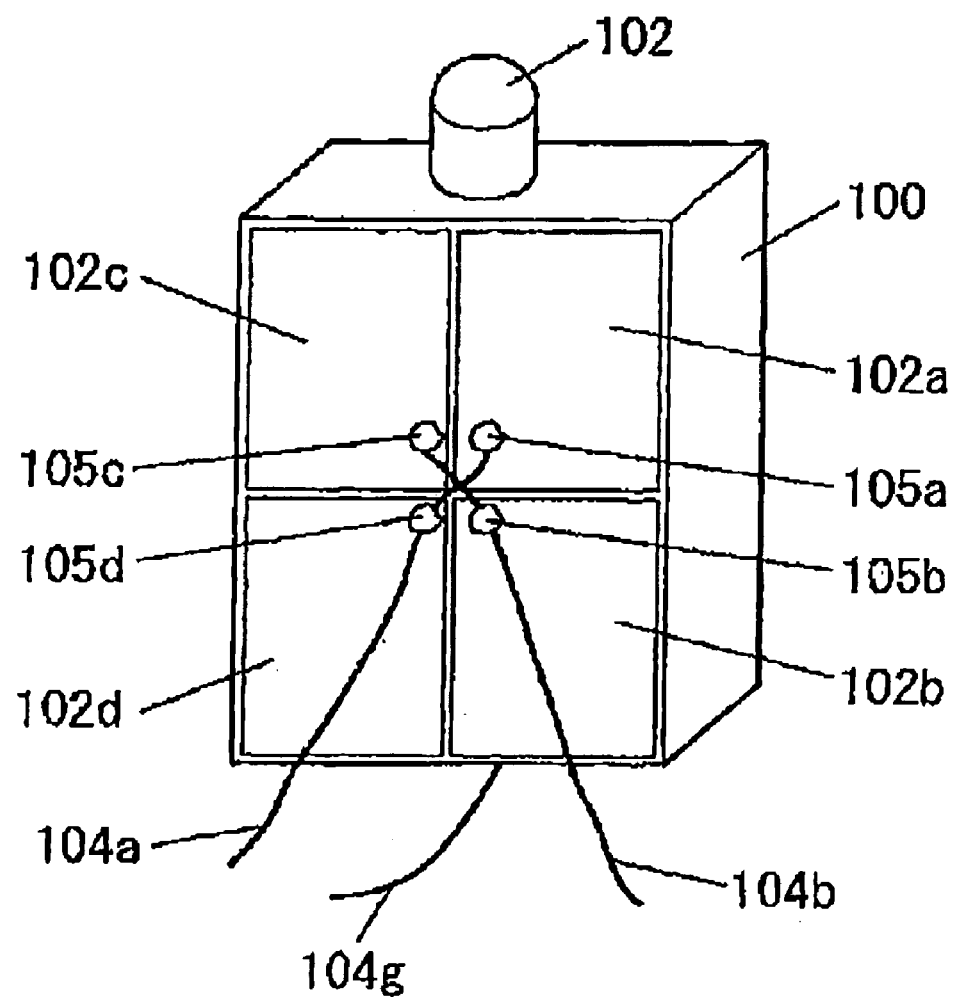
FIG. 13 is a perspective view illustrating a piezoelectric element of a conventional ultrasonic actuator.
Figure 14:
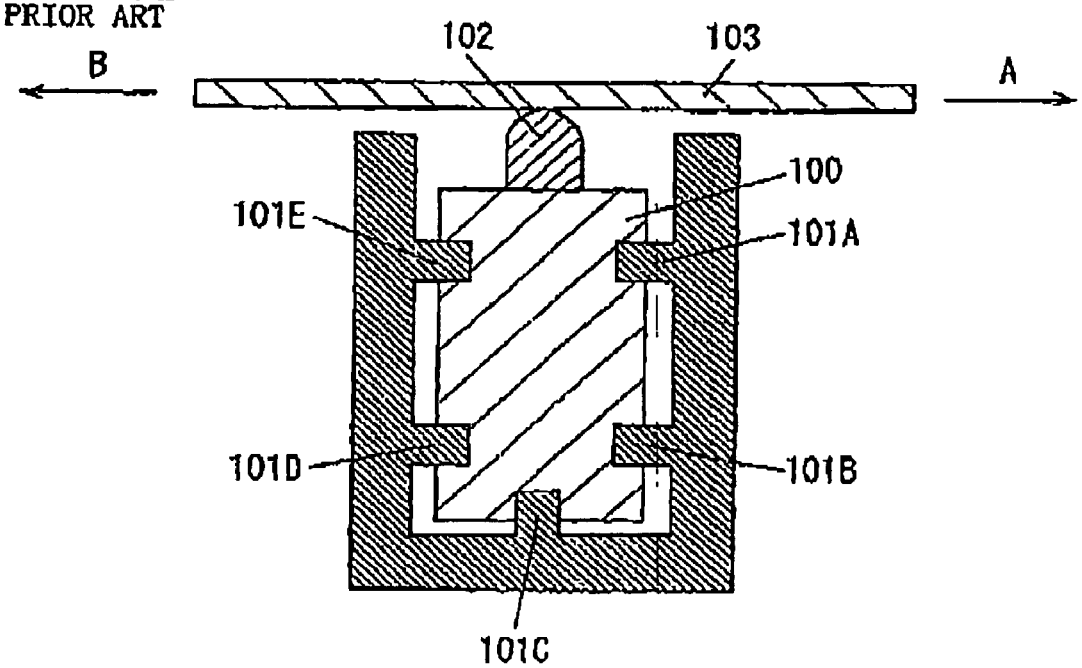
FIG. 14 is a sectional view of the conventional ultrasonic actuator.
Figure 15:
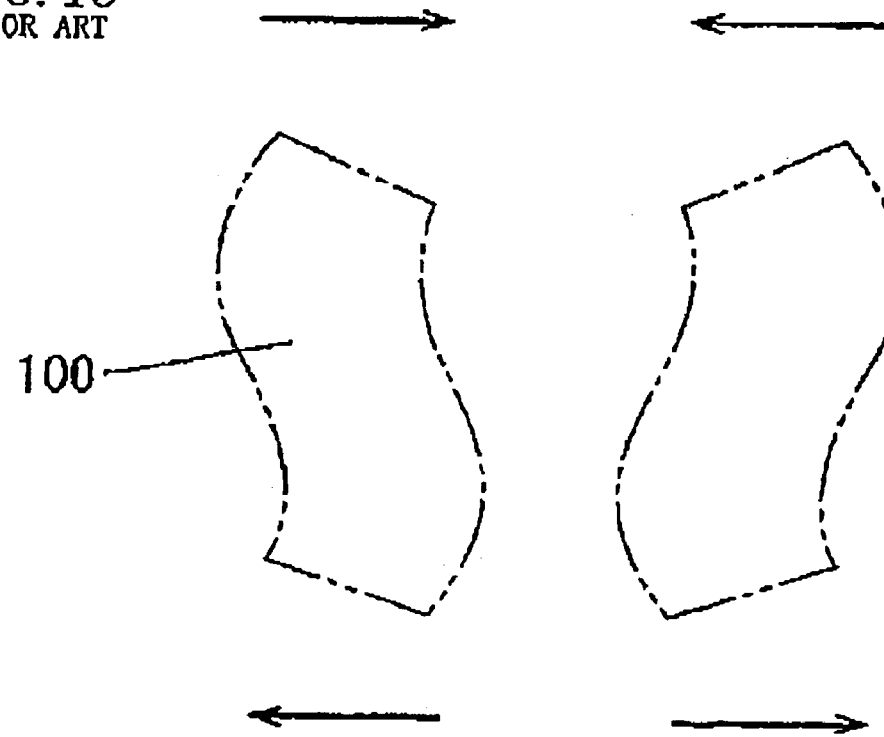
FIG. 15 is a diagram illustrating displacement in a second-order mode of bending vibration.
Figure 16:
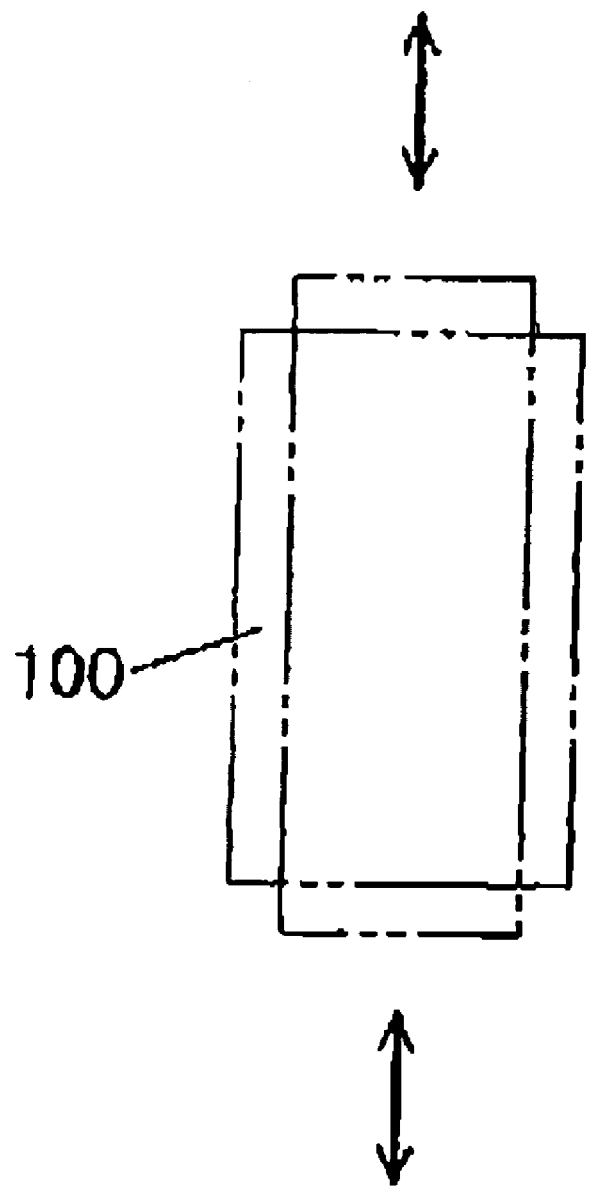
FIG. 16 is a diagram illustrating displacement in a first-order mode of stretching vibration.
Figure 17:
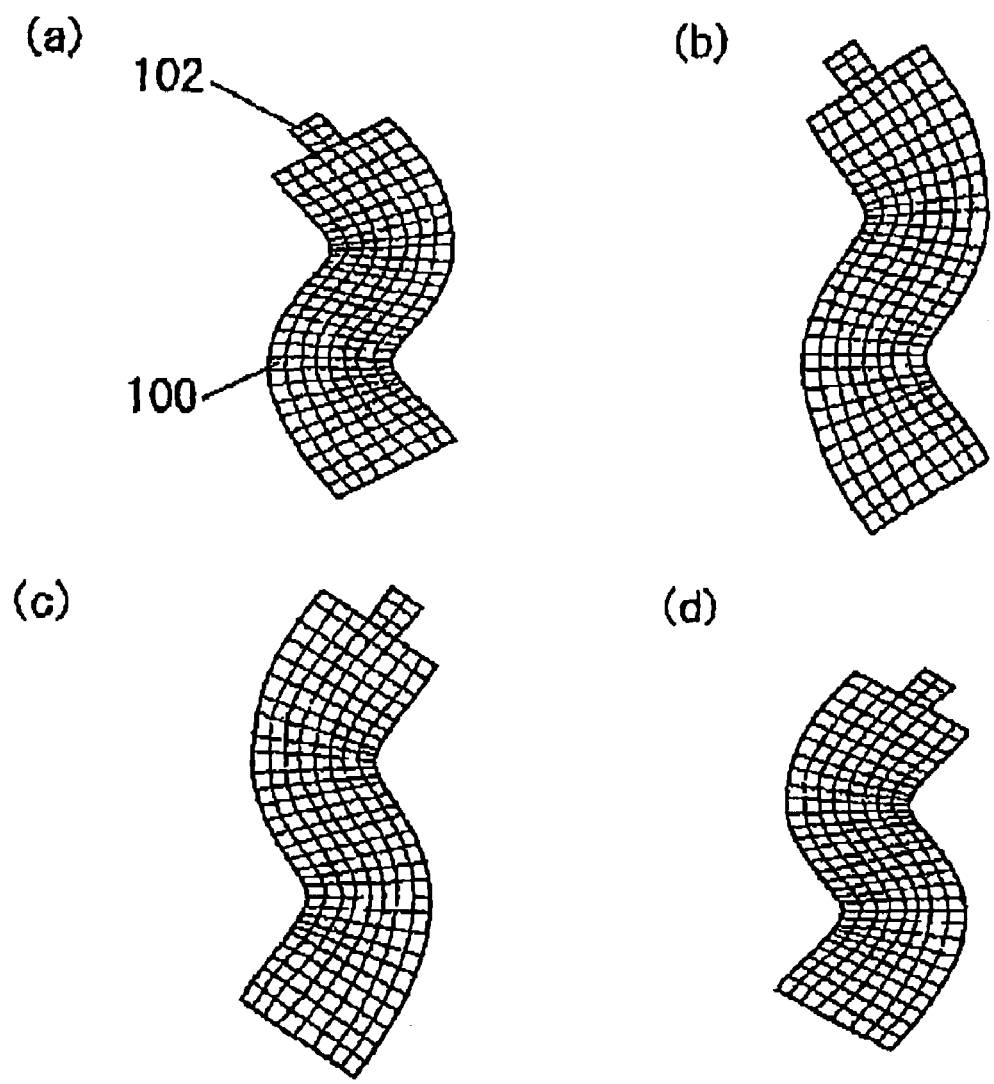
FIGS. 17A to 17D are conceptual diagrams illustrating the operation of a piezoelectric element
Figure 18:
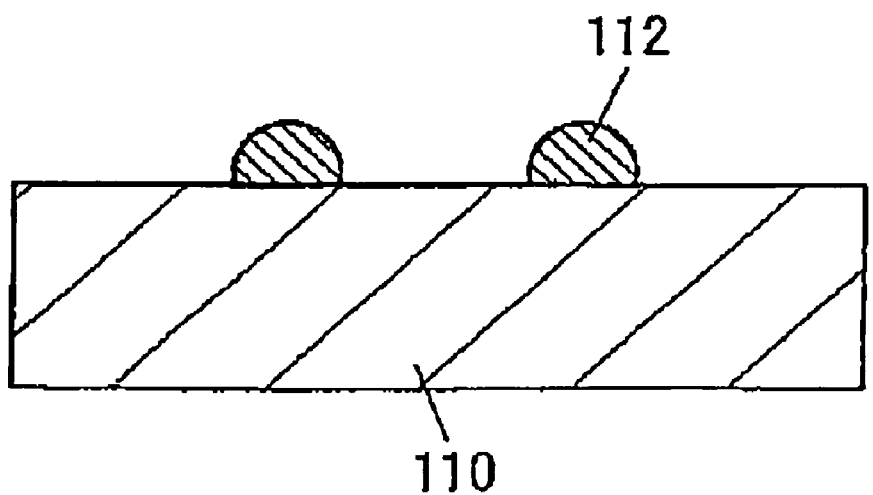
FIG. 18 is a sectional view of the piezoelectric element of the conventional ultrasonic actuator.

In the above-described embodiments, the movable object 3 to be actuated upon application of the driving force of the ultrasonic actuator is in the form of a plate. However, the shape of the movable object is not limited thereto and may optionally be varied as needed. For example, as shown in FIG. 11, the movable object may be configured as a disc 31 capable of rotating about an axis X and the driver elements 2 of the ultrasonic actuator may be brought into contact with an outer edge surface 31a of the disc 31. In such a case, when the ultrasonic actuator is turned on, the disc 31 rotates about the axis X in response to the substantially elliptical motion of the driver elements 2. Further, as shown in FIG. 12, the movable object may be configured as a disc 32 capable of rotating about an axis X and the driver elements 2 of the ultrasonic actuator may be brought into contact with a flat surface 32a of the disc 32. In such a case, when the ultrasonic actuator is turned on, the disc 32 is actuated in the direction of a tangent line at the contact point with the driver elements 2 due to the substantially elliptical motion of the driver elements 2. As a result, the disc 32 is rotated about the axis X.

The bottom-surface supporting parts 5B and 35B are provided on the inner bottom surface of the case 4. However, an opening (not shown) is formed in the bottom surface of the case 4 such that the bottom-surface supporting part supports the piezoelectric element 1 via the opening. In this case, the bottom-surface supporting part is provided on a device into which the ultrasonic actuator is incorporated. When the ultrasonic actuator is incorporated into the device, the bottom-surface supporting part supports the piezoelectric element from the bottom and pressurizes the movable object via the driver elements. In such a case, part of the bottom-surface supporting part to be in contact with the piezoelectric element may be made of an elastic body and the other part thereof may be made of a non-elastic body.

In the embodiments of the present invention, only the first-order mode of stretching vibration and the second-order mode of bending vibration are mentioned. However, other vibration modes such as a first-order mode of stretching vibration and a fourth-order mode of bending vibration may also be applicable.

The wall-surface supporting parts described above are all made of an elastic body. However, the same effect is obtained even if at least one of them is made of the elastic body or only a single annular supporting part surrounding the piezoelectric element is provided and part of the annular supporting part in contact with the piezoelectric element is made of the elastic body.

The feeding electrodes are formed on the front and rear surfaces of the piezoelectric element to achieve a single-panel piezoelectric element. However, the electrodes and the piezoelectric body may be configured as a layered structure. In such a case, a voltage is applied to an outer electrode formed on a certain surface of the piezoelectric element and connected to a plurality of internal electrodes such that the elliptical motion of the driver elements takes place.

The above-described embodiments are only for illustration of preferred examples of the present invention and do not limit the scope of the present invention, the subject of the invention and the scope of the application of the invention.

INDUSTRIAL APPLICABILITY

The ultrasonic actuator according to the present invention includes the driver elements attached to the surface of the piezoelectric element facing the direction of the bending vibration of the piezoelectric element in a point or line contact with the piezoelectric element. Therefore, the ultrasonic actuator achieves high efficiency. Thus, the present invention is useful for electrical devices that require improvement in efficiency and reduction in size.

The invention claimed is:

1. An ultrasonic actuator comprising:
   an actuator body including a piezoelectric element in a whole or in a part, operable to generate vibrations, excluding a traveling wave, in different vibration directions including at least a bending vibration and a longitudinal vibration; and
   a driver element attached to a surface of the actuator body facing the direction of the bending vibration of the actuator body in point or line contact with the actuator body and actuated in accordance with the vibration of the actuator body to output driving force, wherein:
   the driver element is attached to part of the surface of the actuator body corresponding to a non-node of the bending vibration, and
   a center of the driver element is solid.

2. The ultrasonic actuator of claim 1, wherein the driver element is attached to the surface of the actuator body with an adhesive agent.

3. The ultrasonic actuator of claim 2, wherein the adhesive agent is softer than the driver element and the actuator body.

4. The ultrasonic actuator of claim 1, wherein the driver element is cylindrical and arranged in such a manner that an axis thereof is orthogonal to a plane in which the actuator body generates the bending vibration.

5. The ultrasonic actuator of claim 1, wherein the actuator body includes the piezoelectric element and a resonator which is provided with the piezoelectric element and generates various kinds of vibrations having different vibration directions including at least a bending vibration and the driver element is cylindrical and arranged in such a manner that an axis thereof is orthogonal to a plane in which the actuator body generates the bending vibration.

6. The ultrasonic actuator of claim 1, wherein
the driver element is attached to a portion of the surface of the actuator body corresponding to an antinode of the bending vibration.

7. The ultrasonic actuator of claim 1, wherein
the actuator body generates a second-order mode of bending vibration and a first-order mode of a longitudinal vibration.

8. An ultrasonic actuator comprising:
an actuator body including a piezoelectric element in a whole or in a part, operable to generate vibrations, excluding a traveling wave, in different vibration directions including at least a bending vibration and a longitudinal vibration; and
a driver element attached to a surface of the actuator body facing the direction of the bending vibration of the actuator body in point or line contact with the actuator body and actuated in accordance with the vibration of the actuator body to output driving force, wherein:
the driver element is attached to part of the surface of the actuator body corresponding to a non-node of the bending vibration, and
the driver element is spherical and attached to the surface of the actuator body in point contact with the actuator body.

9. The ultrasonic actuator of claim 8 further comprising:
an annular component provided on the surface of the actuator body to surround a contact portion between the driver element and the surface of the actuator body, wherein
the driver element is attached to the surface of the actuator body with the annular component interposed therebetween.

10. The ultrasonic actuator of claim 9, wherein
the driver element and the annular component are attached to the surface of the actuator body with an adhesive agent.

11. The ultrasonic actuator of claim 10, wherein
the annular component is harder than the adhesive agent.

12. An ultrasonic actuator comprising:
an actuator body including a piezoelectric element in a whole or in a part, operable to generate vibrations, excluding a traveling wave, in different vibration directions including at least a bending vibration and a longitudinal vibration; and
a driver element attached to a surface of the actuator body facing the direction of the bending vibration of the actuator body in point or line contact with the actuator body and actuated in accordance with the vibration of the actuator body to output driving force, wherein:
the driver element is attached to part of the surface of the actuator body corresponding to a non-node of the bending vibration,
the actuator body includes the piezoelectric element and further comprises a resonator having the piezoelectric element and generates various kinds of vibrations having different vibration directions including at least a bending vibration, and
the driver element is spherical and attached to the surface of the actuator body facing the direction of the bending vibration of the actuator body.

13. The ultrasonic actuator of claim 12, wherein
the driver element is attached to the surface of the actuator body with an adhesive agent.

14. The ultrasonic actuator of claim 13, wherein
the adhesive agent is softer than the driver element and the actuator body.

15. The ultrasonic actuator of claim 12 further comprising:
an annular component provided on the surface of the actuator body to surround a contact portion between the driver element and the surface of the actuator body, wherein
the driver element is attached to the surface of the actuator body with the annular component interposed therebetween.

16. The ultrasonic actuator of claim 15, wherein
the driver element and the annular component are attached to the surface of the actuator body with an adhesive agent.

17. The ultrasonic actuator of claim 16, wherein
the annular component is harder than the adhesive agent.

* * * * *